(12) United States Patent
Brenner et al.

(10) Patent No.: US 8,951,895 B2
(45) Date of Patent: Feb. 10, 2015

(54) COMPLEMENTARY DOPING METHODS AND DEVICES FABRICATED THEREFROM

(75) Inventors: Kevin Andrew Brenner, Alpharetta, GA (US); Raghunath Murali, Mableton, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 391 days.

(21) Appl. No.: 12/957,329

(22) Filed: Nov. 30, 2010

(65) Prior Publication Data

US 2011/0127638 A1    Jun. 2, 2011

Related U.S. Application Data

(60) Provisional application No. 61/265,040, filed on Nov. 30, 2009.

(51) Int. Cl.
| | |
|---|---|
| *H01L 29/00* | (2006.01) |
| *H01L 29/16* | (2006.01) |
| *B82Y 10/00* | (2011.01) |
| *H01L 21/04* | (2006.01) |
| *H01L 29/06* | (2006.01) |
| *H01L 29/10* | (2006.01) |
| *H01L 29/12* | (2006.01) |
| *H01L 29/41* | (2006.01) |
| *H01L 29/66* | (2006.01) |

(52) U.S. Cl.
CPC ............ *H01L 29/1606* (2013.01); *B82Y 10/00* (2013.01); *H01L 21/041* (2013.01); *H01L 29/0665* (2013.01); *H01L 29/1045* (2013.01); *H01L 29/127* (2013.01); *H01L 29/413* (2013.01); *H01L 29/66439* (2013.01); *H01L 29/66* (2013.01)
USPC ........... 438/510; 438/535; 438/522; 438/530; 438/502; 438/514

(58) Field of Classification Search
CPC ........ C30B 33/02; C30B 15/04; C30B 31/20; H01L 29/00; H01L 21/041
USPC ......... 438/527, 518, 519, 522, 530, 407, 520, 438/528, 548, 549, 502, 505, 487, 510, 535
See application file for complete search history.

(56) References Cited

U.S. PATENT DOCUMENTS

| | | | |
|---|---|---|---|
| 5,994,209 A * | 11/1999 | Yieh et al. | 438/541 |
| 6,066,442 A * | 5/2000 | Kurachi et al. | 430/530 |
| 7,224,065 B2 * | 5/2007 | Doan | 257/765 |
| 2006/0154462 A1 * | 7/2006 | Saino | 438/592 |
| 2006/0228897 A1 * | 10/2006 | Timans | 438/758 |
| 2008/0048240 A1 * | 2/2008 | Kamath et al. | 257/315 |

(Continued)

*Primary Examiner* — Chuong A Luu
(74) *Attorney, Agent, or Firm* — Troutman Sanders, LLP; Ryan A. Schneider; Elizabeth-Ann Gould

(57) ABSTRACT

Improved complementary doping methods are described herein. The complementary doping methods generally involve inducing a first and second chemical reaction in at least a first and second portion, respectively, of a dopant source, which has been disposed on a thin film of a semiconductor or semimetal material. The chemical reactions result in the introduction of an n-type dopant, a p-type dopant, or both from the dopant source to each of the first and second portions of the thin film of the semiconductor or semimetal. Ultimately, the methods produce at least one n-type and at least one p-type region in the thin film of the semiconductor or semimetal.

19 Claims, 8 Drawing Sheets

(56) References Cited

U.S. PATENT DOCUMENTS

| | | | |
|---|---|---|---|
| 2009/0039469 A1* | 2/2009 | Tin et al. | 257/609 |
| 2009/0111252 A1* | 4/2009 | Huang et al. | 438/530 |
| 2010/0062562 A1* | 3/2010 | Smythe et al. | 438/102 |
| 2010/0105185 A1* | 4/2010 | Ku et al. | 438/301 |
| 2012/0003438 A1* | 1/2012 | Appleton et al. | 428/195.1 |

* cited by examiner

US 8,951,895 B2

COMPLEMENTARY DOPING METHODS AND DEVICES FABRICATED THEREFROM

CROSS-REFERENCE TO RELATED APPLICATION

The present application claims the benefit of U.S. Provisional Patent Application Ser. No. 61/265,040, filed 30 Nov. 2009, and entitled "Single-Step Complementary Doping Method for Graphene" which is hereby incorporated by reference in its entirety as if fully set forth below.

STATEMENT OF FEDERALLY SPONSORED RESEARCH

This invention was made with United States Government support under agreement number HR0011-07-3-0002, awarded by DARPA. The United States Government has certain rights in this invention.

TECHNICAL FIELD

The various embodiments of the present invention relate generally to complementary doping methods. More particularly, the various embodiments of the present invention relate to methods for doping a given material to have both n-type and p-type doped regions using a single dopant source, as well as to various electronic devices formed therefrom.

BACKGROUND

Complementary doping of semiconducting materials, which entails the creation of specified n-type regions (i.e., regions where the conductivity is dominated by electrons) and p-type regions (i.e. regions where the conductivity is dominated by holes), is necessary for the formation of complementary metal oxide semiconductor (CMOS) circuitry that is found in many modern electronic devices. As fabrication technology, and thus the size of devices, is scaled down, new thin-film materials will be relied upon to replace bulk CMOS materials. As such, new complementary doping methods will be needed to implement these post-CMOS thin-film-based technologies.

Existing doping methods involve implanting or diffusing dopant atoms into the bulk (i.e., non-surface layers) of a material, thus generating an electron- or hole-populated region. While such methods are suitable for bulk materials, such methods will be largely ineffective on thin-film materials, particularly on films having only a limited number of layers.

There accordingly remains a need in the art for improved doping techniques for thin-film materials. There is a specific need for complementary doping methods that are less intrusive than bulk implantation or diffusion would be on a thin film material. It would be beneficial if such methods could provide greater control in the introduction and positioning of dopant atoms than existing methods. It is to the provision of such methods that the various embodiments of the present invention are directed.

BRIEF SUMMARY

The various embodiments of the present invention provide improved complementary doping methods that can overcome the above-described deficiencies associated with currently existing doping techniques.

According to some embodiments of the present invention, a complementary doping method can include providing a thin film of a semiconductor or semimetal disposed on a substrate; disposing a dopant source on the thin film of the semiconductor or semimetal; inducing a first chemical reaction in at least a first portion of the dopant source effective to introduce an n-type dopant, a p-type dopant, or both to the at least the first portion of the thin film of the semiconductor or semimetal; and inducing a second chemical reaction in at least a second portion of the dopant source effective to introduce an n-type dopant, a p-type dopant, or both to the at least the second portion of the thin film of the semiconductor or semimetal. The first and second chemical reaction can be effective to produce at least one n-type and at least one p-type region in the thin film of the semiconductor or semimetal.

The semimetal can be, for example, graphene.

In some cases, the dopant source can comprise an electromagnetic radiation-sensitive material. In certain instances, this electromagnetic radiation-sensitive material is a polymer precursor, a polymer, or a resist material.

In other cases, the dopant source can be a spin-on glass, wherein the spin-on glass can be, for example, silicate, siloxane, phosphosilicate, or borosilicate. In some cases, the siloxane can be a poly(silsequioxane).

Further, inducing the first and/or second chemical reaction can comprise irradiating with a light source, irradiating with an ion beam source, irradiating with an electron beam source, thermally heating, dielectrically heating, or a combination thereof.

Even further, the first and/or second chemical reaction can comprise a polymerization, a solvent removal, a cross-linking, an internal rearrangement of atoms or moieties, or a combination thereof.

The method can further include a step of inducing a third chemical reaction in at least a third portion of the dopant source effective to introduce an n-type dopant, a p-type dopant, or both to the third portion of the thin film of the semiconductor or semimetal.

The distance between an n-type and a p-type region in the thin film of the semiconductor or semimetal can be less than or equal to about 30 nanometers. In some cases, this distance can be less than or equal to about 10 nanometers.

The method can further include removing an unreacted portion of the dopant source from the thin film of the semiconductor or semimetal.

Even further, the method can comprise sealing a surface of the thin film of the semiconductor or semimetal after inducing the second chemical reaction.

According to other embodiments of the present invention, an electronic device can be formed using any of the above steps or features of the complementary doping method.

According to other embodiments of the present invention, a complementary doping method can include providing a thin film of graphene on a substrate; spin-coating a spin-on glass on the thin film of the graphene; inducing a first chemical reaction in at least a first portion of the spin-on glass effective to introduce an n-type dopant, a p-type dopant, or both to the at least the first portion of the thin film of the graphene; and inducing a second chemical reaction in at least a second portion of the spin-on glass effective to introduce an n-type dopant, a p-type dopant, or both to the at least the second portion of the thin film of the graphene. The first and second chemical reaction can be effective to produce at least one n-type and at least one p-type region in the thin film of the graphene.

Inducing the first chemical reaction can include thermally treating the at least the first portion of the spin-on glass to remove a solvent from the spin-on glass, and can be effective to produce an n-type region in the at least the first portion of the spin-on glass.

Further, inducing the second chemical reaction can involve irradiating the at least the second portion of the spin-on glass to cross-link the at least the second portion of the spin-on glass, and can be effective to produce a p-type region in the at least the second portion of the spin-on glass.

In some cases, inducing the first chemical reaction and/or inducing the second chemical reaction can entail irradiation with electromagnetic radiation to cross-link an irradiated portion of the spin-on glass.

This method can also include removing at least an unreacted portion of the spin-on glass without affecting the at least one n-type and at least one p-type region in the thin film of the graphene.

Other aspects and features of embodiments of the present invention will become apparent to those of ordinary skill in the art, upon reviewing the following detailed description in conjunction with the accompanying figures.

BRIEF DESCRIPTION OF THE DRAWINGS

FIG. 2(b) provides I-V curves for the same three devices after spin-coating about 30 nm of HSQ, baking, and developing without electron-beam irradiation or plasma exposure. It can be seen from the left shift of the Dirac point that the devices have been strongly n-type doped. FIG. 2(c) provides a SEM of an exposed HSQ circle over a grapheme device. FIG. 2(d) provides I-V curves for the same three separate devices, after exposing an HSQ circle over the graphene flake. It can be seen that all devices show Dirac points residing beyond about 100 V, indicating strong p-type doping.

FIG. 5(b) provides a SEM of the fabricated device, wherein an HSQ film is deposited atop the entire graphene surface, and half of the device was exposed to electron beam irradiation while the other half was left unexposed. This was followed by a development step.

FIG. 6(a) is an SEM image of the electron waveguide device; and FIG. 6(b) is a schematic illustration of the electron waveguide device.

FIG. 7(a) is an SEM image of the transistor-like device; and FIG. 7(b) is a schematic illustration of the transistor-like device.

FIG. 8(a) is an SEM image of the p-n junction dot array device; and FIG. 8(b) is a schematic illustration of the p-n junction dot array device.

DETAILED DESCRIPTION

Figure 1:
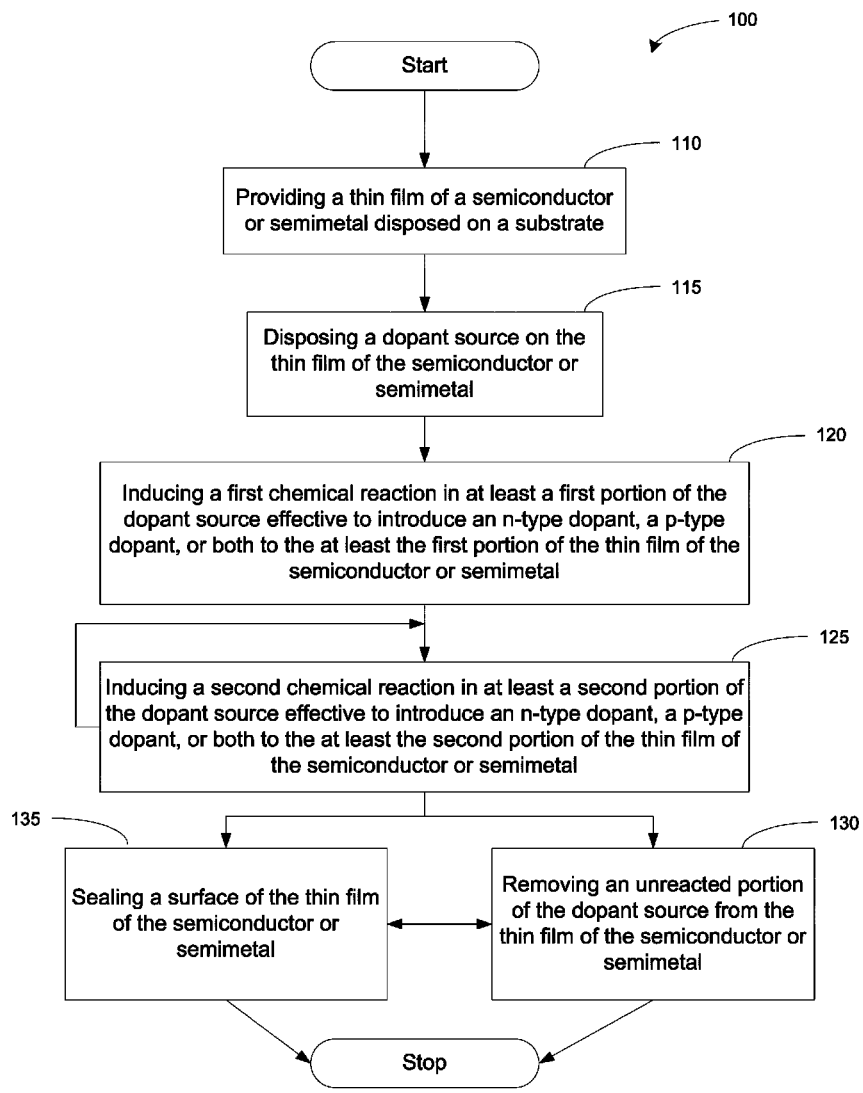
FIG. 1 is a process flow diagram illustrating a complementary doping method in accordance with some embodiments of the present invention.

Referring now to the figures, wherein like reference numerals represent like parts throughout the several views, exemplary embodiments of the present invention will be described in detail. Throughout this description, various components can be identified as having specific values or parameters, however, these items are provided as exemplary embodiments. Indeed, the exemplary embodiments do not limit the various aspects and concepts of the present invention as many comparable parameters, sizes, ranges, and/or values can be implemented. The terms "first," "second," and the like, "primary," "secondary," and the like, do not denote any order, quantity, or importance, but rather are used to distinguish one element from another. Further, the terms "a," "an," and "the" do not denote a limitation of quantity, but rather denote the presence of "at least one" of the referenced item.

As briefly described above, improved complementary doping methods (i.e., methods of doping a particular material to have at least one n-type and p-type region) are described herein. The improved complementary doping methods of the present invention are generally based on inducing chemical reactions in a dopant source to introduce the desired type (i.e., n-type or p-type) of dopant from the dopant source to specified portions of the material sought to be doped. In contrast to existing doping methods, the doping methods of the present invention offer high-resolution fabrication of both n- and p-doped regions over large areas of a material. In addition, the methods of the present invention are non-intrusive (i.e., do not involve implantation or diffusion) and can be effected at lower temperatures, thus rendering them more appropriate for doping thin-film materials.

A complementary doping method, according to some embodiments of the present invention, is shown in FIG. 1. This method, generally designated by reference numeral 100, first includes providing a thin film of the material to be doped 110. As used herein, the term "thin film," when referencing the material to be doped, is intended to encompass films wherein the active layer, or layer through which conduction occurs, is influenced by charge transfer at the surface of the film. That is, the surface of the thin film should be able to inject charge into the active layer of the film, which can be the surface layer(s) or the entire film (if the film is sufficiently thin).

The material to be doped generally will be a semiconductor or a semimetal. By way of example, the semiconductor can be chosen from elemental semiconductors, including Group IV elements (e.g., diamond, Si, or Ge); compound semiconductors, including Group IV-IV semiconductors (e.g., SiC, SiGe), Group III-V semiconductors (e.g., AN, AlP, BN, GaAs, GaN, GaP, InAs, InP, AlGaAs, InGaP, AlGaInP, and other binary, ternary, or multi-nary compounds formed from at least one Group III and at least one Group V element), Group II-VI semiconductors (e.g., CdSe, CdS, CdTe, ZnO, ZnSe, ZnTe, CdZnTe, HgCdTe, HgZnSe, and other binary, ternary, or multi-nary compounds formed from at least one Group II and at least one Group VI element), and the like; and other like semiconductor materials. Similarly, the semimetal can be chosen from elemental semimetals, including graphite, graphene, Sn, As, Sb, Bi, or the like; compound semimetals, including HgTe, and the like; and other like semimetals.

There is no particular limitation as to the type of semiconductor or semimetal that can be used, other than that it must be stable under the conditions to which it will be exposed. For example, the semiconductor or semimetal should be chosen so as to not decompose or volatilize under the conditions implemented in the doping method. Selection of an appropriate material, given the conditions of the method implemented, will be within the capabilities and understanding of those skilled in the art to which this disclosure pertains.

Once the material to be doped has been chosen, a thin film thereof can be disposed on a substrate. The thin film of the material to be doped can be prepared using conventional thin-film-growing techniques. These include chemical vapor deposition and all of its variants, physical vapor deposition and all of its variants, spin coating, plating and all of its variants, sol-gel deposition, reactive sputtering and all of its variants, epitaxial deposition, molecular beam epitaxy, and the like. When the thin film of the material to be doped is not directly fabricated on the substrate (e.g., when a thin film of the material to be doped is mechanically exfoliated from a bulk sample of the material), it can be transferred to the substrate using any mechanical or chemical transfer technique. Such thin film-growing and transferring techniques will be well known to those skilled in the art to which this disclosure pertains.

After fabricating the thin film of the material to be doped, the dopant source can be disposed on the thin film 115. The dopant source generally is an energy-sensitive material. Exemplary energy-sensitive materials include electromagnetic radiation-(EMR) sensitive materials (e.g., light-sensitive or photosensitive materials, electron beam-sensitive materials, ion-beam sensitive materials, and the like) and thermally-sensitive materials. EMR-sensitive materials can include polymer precursors, polymers, photoresist materials, or the like. By way of example, electron beam-sensitive materials include polymethyl methacrylate, a copolymer of methyl styrene and chloromethyl acrylate, 1-methyl-2-pyrrolidone, n-butyl acetate, cyclohexanone and the like. An example of a thermally-sensitive material includes spin-on glass materials, which in some cases also can be EMR-sensitive materials, such as a silicate, siloxane, phosphosilicate, borosilicate, or the like.

There is no particular limitation as to the type of dopant source used, other than that it must comprise the source of both the n-type dopant and the p-type dopant. The specific n-type dopant and p-type dopant atom, and thus by extension, the dopant source, will depend on the choice of the material to be doped. Those skilled in the art to which this disclosure pertains readily will be able to select the appropriate n- and p-type dopants based on a given semiconductor or semimetal material to be doped.

Once the dopant source has been chosen, a layer thereof can be disposed on the thin film of the material to be doped. The layer of the dopant source can be disposed on the thin film using any of the techniques described above for fabricating the thin film of the semiconductor or semimetal material to be doped. Generally, thicker layers of the dopant source will result in lower spatial resolution between doped regions of the semiconductor or semimetal thin film. Thus, in applications where higher resolution (finer spacing distances between doped regions) is desired, those skilled in the art will recognize that thinner layers of the dopant source will be needed.

After placing the dopant source on the thin film of the semiconductor or semimetal material to be doped, the chemical reactions can be induced in the dopant source so as to introduce the dopant atoms to the semiconductor or semimetal. That is, a first chemical reaction is induced in at least a first portion of the dopant source effective to introduce an n-type dopant, a p-type dopant, or both to the first portion of the thin film of the semiconductor or semimetal 120. Then, a second chemical reaction is induced in at least a second portion of the dopant source effective to introduce an n-type dopant, a p-type dopant, or both to the second portion of the thin film of the semiconductor or semimetal 125. Subsequent chemical reactions can be induced in other portions of the dopant source to dope other portions of the thin film. Ultimately, these chemical reactions produce at least one p-type and at least one n-type region in the thin film.

The specific chemical reactions that are induced, and the means by which they are induced, will depend on the choice of dopant source. For example, if the dopant source is a light-sensitive material, then a light source (e.g., ultraviolet light, deep ultraviolet light, an electron beam, an ion beam, a plasma beam, or other like light source to which the dopant source is sensitive) can be used to induce a chemical reaction therein. Similarly, when the dopant source is a spin-on glass, a chemical reaction therein can be induced by thermal heat transfer, dielectric heat transfer, light, or the like.

There are a variety of chemical reactions that can be induced in the dopant source in order to introduce the dopant to the semiconductor or semimetal. For example, when the dopant source is a photosensitive polymer precursor, it can undergo a light-initiated polymerization and/or cross-linking reaction that will result in certain atoms or moieties being removed from the polymer precursor and introduced into or onto the semiconductor or semimetal. Similarly, when the dopant source is a polymer, it can undergo a light-initiated cross-linking reaction that will result in certain atoms or moieties being removed from the polymer. These atoms or moieties can be introduced to the semiconductor or semimetal, or they can be at least partially outgassed, while leaving behind the appropriate atoms, moieties, or charge carriers for doping to occur. When a photoresist material is used as the dopant source, it can undergo a light-initiated internal rearrangement or reaction, wherein certain atoms or moieties will be released from the photoresist (or solvent/resin component thereof) and introduced to the semiconductor or semimetal (at least partially outgassed, while leaving behind the appropriate atoms, moieties, or charge carriers for doping to occur). When the dopant source is a spin-on glass, heat and/or EMR can be used to cross-link the spin-on glass into a networked structure, resulting in certain atoms or moieties being removed from the spin-on glass and introduced to the semiconductor or semimetal (or at least partially outgassed, while leaving behind the appropriate atoms, moieties, or charge carriers for doping to occur). In addition, if the dopant source was chemically applied to the semiconductor or semimetal thin film, it can first be heated in order to remove any solvent contained therein and/or to increase the interaction (e.g., via adhesion, bonding, and/or electrostatics) with the semiconductor or semimetal. The breaking of bonds in the removal of the solvent molecule and/or coupling of the dopant source to the semiconductor or semimetal can serve as a source of dopant atoms or moieties too.

Two non-limiting examples of these steps of the method will now be provided for additional clarity. In the first example, the dopant source is a photosensitive polymer precursor. After the photosensitive polymer precursor is disposed on the thin film of the semiconductor or semimetal, at least a portion (i.e., at least some portion and as much as all) of the photosensitive polymer precursor is exposed to a beam of light having a first energy. This results in polymerization of the exposed portion, where the polymerization reaction involves the removal of one or more atoms from each precursor molecule. These atoms (e.g., H, O, C, N, and the like), which can serve as an n-type dopant, a p-type dopant, or both, interact with the surface of the semiconductor or semimetal, thereby providing a charge carrier of the desired type to the semiconductor or semimetal.

Next, at least another portion of the photosensitive polymer precursor is exposed to a beam of light having a second energy (which can be the same energy as the first beam of light, but for a different duration). This also results in polymerization of the exposed portion. This second polymerization reaction can be the same as the first polymerization reaction (e.g., if the light source of the first energy was capable of producing both n-type and p-type dopants, and a change in the shape/size of the doped region or in the carrier concentration of the doped region is desired), or it can be different from the first polymerization reaction (e.g., to produce the second type of dopant if the light source of the first energy was only capable of producing one type of dopant). Regardless, this second polymerization reaction also results in the removal of one or more atoms from each precursor molecule in the exposed portion. These atoms can serve as an n-type dopant, a p-type dopant, or both by interacting with the surface of the semiconductor or semimetal. As a result, the semiconductor or semimetal has at least one n-type and at least one p-type region.

In the second example, the dopant source is a spin-on glass. After the spin-on glass is disposed on the thin film of the semiconductor or semimetal, at least a portion of the spin-on glass is exposed to a heat treatment to remove any solvent contained therein. This results in the breaking of bonds within the solvent, and the movement of the broken portions of the solvent. Some of the atoms from the broken bonds (e.g., H, O, C, N, and the like), which can serve as an n-type dopant, a p-type dopant, or both, interact with the surface of the semiconductor or semimetal, thereby providing a charge carrier of the desired type to the semiconductor or semimetal. Even if the unheated portion of the spin-on glass is subsequently removed (e.g., using a solvent or developer), the dopant will remain in place.

Next, at least another portion of the spin-on glass is exposed to a beam of light having a specific energy. This results in cross-linking of the spin-on glass within the exposed portion. This cross-linking reaction results in the removal of certain atoms from the spin-on glass. These atoms can serve as an n-type dopant, a p-type dopant, or both by interacting with the surface of the semiconductor or semimetal. As described above for the first illustrative example using a photosensitive polymer precursor dopant source, the exposure of the spin-on glass to light (after the heat treatment) can serve to change the shape, size and/or carrier concentration of the doped region and/or introduce the second type of dopant if the heat treatment was only capable of producing one type of dopant. Similarly, even if the unexposed or unirradiated portion of the spin-on glass is subsequently removed (e.g., using a solvent or developer), the dopant will remain in place. Regardless, the combination of the heat treatment and the exposure to light result in the semiconductor or semimetal having at least one n-type and at least one p-type region.

The method optionally can include one or more steps where additional chemical reactions are induced in order to introduce additional dopant to the semiconductor or semimetal thin film. These additional chemical reactions can be induced using any of the techniques described above or otherwise.

Because the chemical reactions serve to introduce dopant atoms to the semiconductor or semimetal material to be doped, these same reactions determine the extent to which the doping occurs. That is, the shape, size, polarity and carrier concentration of, as well as the distance between, the doped regions will be dictated by the control exerted over the chemical reaction. The primary factors that will influence these features include the level of control over the energy source used to induce the chemical reaction, intensity, type, and duration of the reaction.

To illustrate, the use of heat as the energy source to induce the chemical reaction will result in less control over the geometry of, and the resolution between, doped regions than would the use of a focused light source. In addition, a smaller light beam and greater control over the movement thereof will result in greater ability to precisely tailor the geometry of the doped regions and greater resolution between doped regions. Many focused light sources will allow for resolutions of less than or equal to about 100 nanometers; and some focused light sources will allow for resolutions of less than or equal to about 30 nanometers. In certain cases, resolutions of less than or equal to about 10 nanometers can be achieved. Those skilled in the art to which this disclosure pertains will be able to select an energy source to suit the desired control over geometry and resolution of the doped regions for a particular application.

In contrast, the carrier concentration and the polarity of the doped region will be more affected by the intensity, type, and/or duration of the reaction than the ability to exert control over the energy source that is used to induce the chemical reaction. Specifically, the intensity of the energy source used to induce the chemical reaction and the type of chemical reaction will influence the type of atoms available to be introduced to the material to be doped. Thus, these parameters directly influence the polarity of the doped region. Similarly, the intensity of the energy source used to induce the chemical reaction and the duration of the exposure to the energy source to induce the chemical reaction will influence the number of atoms available to be introduced to the material to be doped. Thus, these parameters directly influence the carrier concentration of the doped region. Ultimately, by controlling the intensity, type, and/or duration of the reaction, n-type and p-type regions can be fabricated to have carrier concentrations of $7 \times 10^{12}$ carriers/cm$^2$. In some cases, carrier concentrations on the order of about $10^{14}$ carriers/cm$^2$ can be achieved.

In addition to the above steps, the method optionally can include a step where the unreacted dopant source is removed from the surface of the semiconductor or semimetal thin film 130. This can be accomplished using a medium (e.g., a solvent, developer, or the like) in which the unreacted portion of the dopant source is soluble, an etching process, or the like. Such techniques are known to those skilled in the art to which this disclosure pertains.

Another optional step involves sealing the surface of the doped semiconductor or semimetal thin film with a neutral passivating material or using vacuum packaging techniques 135 so as to prevent the surface from being adversely affected by subsequent device fabrication or processing steps. Such materials include silica, neutral polymers, or the like. Such materials and techniques for passivating a surface are known to those skilled in the art to which this disclosure pertains.

Once the various steps of the complementary doping method described above are completed, the resultant doped material can be implemented in an electronic device. Using the above-described method, a variety of electronic devices can be fabricated. As would be understood by those skilled in the art to which this disclosure pertains, any electronic device that implements at least one n-type region and at least one p-type region can be fabricated. Such devices include basic diodes (e.g., comprising a p-n junction, a p-i-n junction, or similar diode geometry) and transistors, as well as more complex devices (e.g., electron waveguides, electron and Veselago lenses, p-n junction dot arrays, Klein-tunneling-based transistors, electron ratchet devices, and the like) making use of such diodes and transistors. Such devices, and fabrication thereof are known to those skilled in the art to which this disclosure pertains.

One exemplary implementation of the above-described complementary doping method involves the use of a spin-on glass material to dope graphene. Graphene has recently attracted much interest as an electronic material. With its superior electron transport properties and potential for top down fabrication, graphene has the potential to yield truly monolithic systems (i.e., with graphene functioning as both the interconnect and switching device).

The complementary doping method first involves providing a thin film of graphene. This can be accomplished using any method for fabricating and/or collecting graphene. These methods include forming a thin film of graphene by exfoliating highly-oriented pyrolitic graphite, and placing single layer graphene or so-called few layer graphene on the surface of a substrate, growing graphene epitaxially through the thermal sublimation of silicon carbide in a high vacuum radio frequency induction furnace, chemical vapor deposition, reduction of graphite oxide, and the like. Such methods are known to those skilled in the art to which this disclosure pertains.

Once the thin film of graphene has been formed, the spin-on glass can be disposed on the thin film via spin coating. The spin-on glass can be a siloxane material, such as poly(silsequioxane). Examples of poly(silsequioxane) include hydrogen silsequioxane (HSQ), methyl silsequioxane (MSQ), phenyl-methyl silsequioxane, and the like. For convenience, reference will now be made to HSQ as the dopant source.

The HSQ layer is then subjected to a heat treatment to remove any solvent within the layer of HSQ. This step results in the release of hydrogen atoms, which are introduced to the surface of the graphene film and serve as n-type dopant atoms. At this point, the entire HSQ-covered graphite film is an n-type region.

Next, half of the HSQ layer is cross-linked using electron beam radiation. The electron beam radiation results in the transition of the exposed portion of HSQ from a cage structure to a network structure. This transition breaks silicon-oxygen and silicon-hydrogen to release oxygen, silicon, and hydrogen atoms. The hydrogen atoms can recombine with the hydrogen atoms that were on the surface of the graphene as a result of the solvent removal step to form hydrogen gas that can escape, leaving behind oxygen atoms to interact with the surface of the graphene film. Alternatively, the hydrogen atoms can combine with silicon atoms to form silane gas, which can escape as well, leaving behind oxygen atoms to interact with the surface of the graphene film. The oxygen atoms serve as p-type dopant atoms. Thus, the undoped graphite film has been converted into a p-n junction.

In an alternative implementation, the HSQ (or other spin-on glass dopant source material) can be subjected to two separate cross-linking steps, rather than a heat treatment and a single cross-linking step. The first cross-linking step can be implemented using lower energy radiation, which will serve the same purpose as the heat treatment of the implementation described above (i.e., to n-type dope the irradiated portion); while the second cross-linking step can be implemented using a higher energy radiation, which will serve the same purpose as the electron beam radiation of the implementation described above (i.e., to p-type dope the second irradiated portion). In this manner, there can be more control over the geometry and resolution of the doped regions than when the heat treatment is used. As a result, there is more diversity in the products that can be formed. For example, the undoped graphite film can be converted into multiple p-n junctions, a p-i-n junction, a side-gated transistor, and the like.

EXAMPLES

The present disclosure is further exemplified by the following non-limiting examples.

Example 1

In this example, the doping methods disclosed herein were demonstrated by producing high resolution n- and p-type doping of large area graphene. HSQ was used as the dopant source. In addition, a high-resolution graphene p-n junction was fabricated.

First, the effect of electron-beam-induced cross-linking in HSQ on carrier transport in few layer graphene (i.e., about 1 to about 4 atomic layers) was studied. Two samples were fabricated by applying mechanically exfoliated graphene flakes to an oxidized Si substrate with an oxide thickness of about 300 nanometers (nm). The thickness of the flakes was verified using confocal Raman imaging and atomic force microscope (AFM) measurements. A JEOL JBX 9300-FS electron beam lithography (EBL) system was used to pattern metal contacts (formed from about 10 nm thick Ti/90 nm thick Au). Each sample contained multiple devices.

Figure 2:
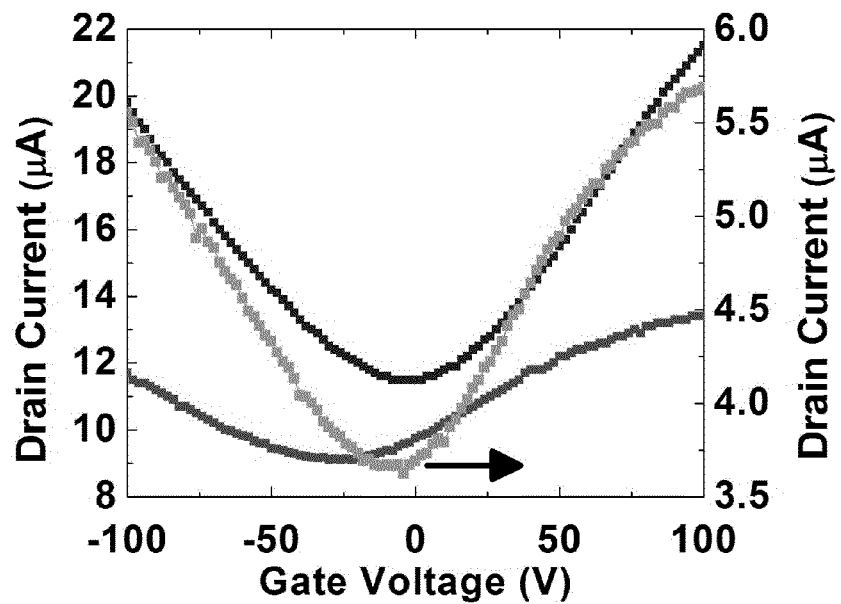
FIG. 2 provides the gated I-V curves for three separate devices and a scanning electron microscope (SEM) image of a patterned device in accordance with EXAMPLE 1. Specifically, FIG. 2(a) provides I-V curves for three devices after contact metallization. It can be seen that all devices reveal Dirac points residing relatively close to about 0 V. This indicates little intrinsic doping in the graphene from initial processing.
Figure 2:
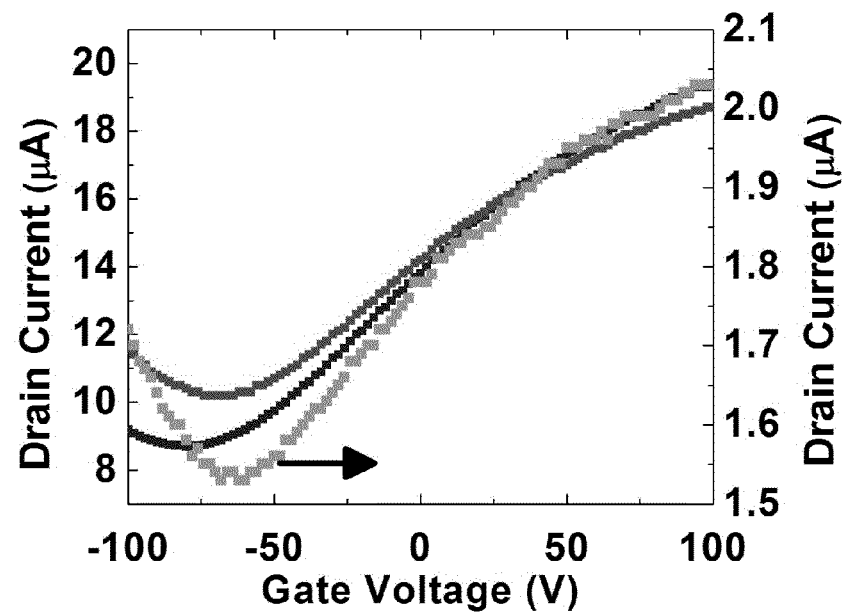
Figure 2:
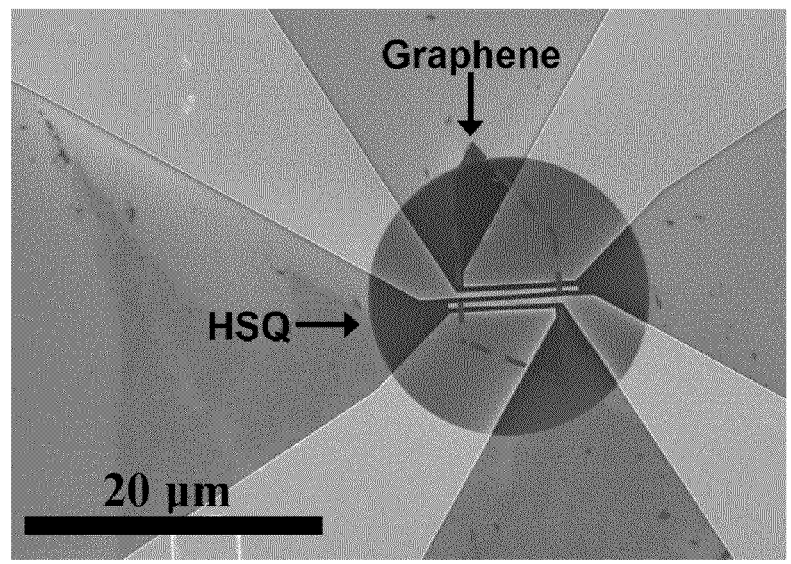
Figure 2:
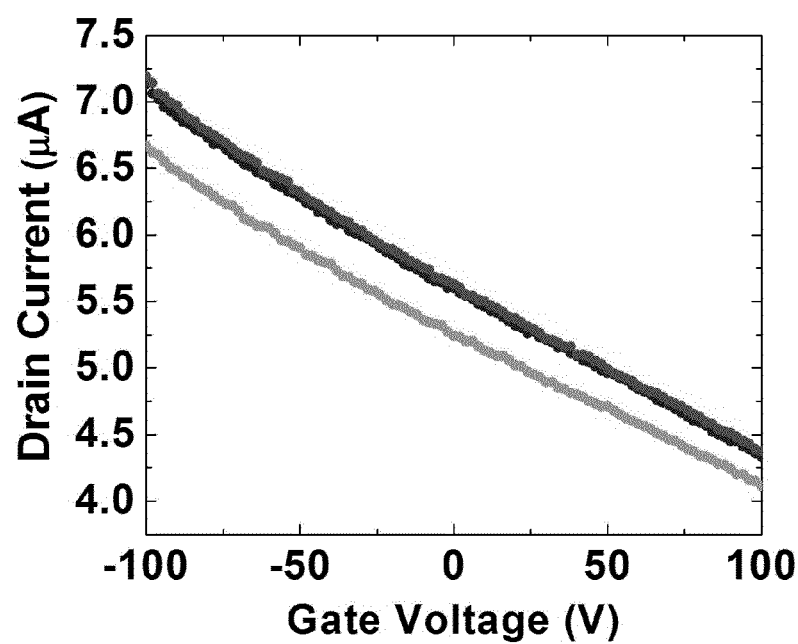

The samples were tested for their Dirac point voltage ($V_D$) with a back-gate and were found to have little initial doping with respect to the HSQ induced shift, as shown in FIG. 2(a). The initial doping level present in these devices was a result of exposure to the ambient environment and not of residual resist; proper solvent cleaning was performed. The samples were then coated with about 30 nm HSQ and baked for about 3 minutes at about 180 degrees Celsius. One sample was developed in tetramethylammonium hydroxide (TMAH), washing away the HSQ. Post-development electrical testing of this sample revealed a strong n-type doping as indicated by the shift of the Dirac point to a larger negative gate voltage, as evidenced in FIG. 2(b). The second sample was patterned with EBL. The pattern included large HSQ regions (about 20 micrometers in diameter) covering each flake with a dose of 3200 micro coulombs per square centimeter ($\mu C/cm^2$), as shown in FIG. 2(c). I-V testing of these devices revealed a large positive shift of the Dirac point, thus indicating a strong p-type doping, as can be seen in FIG. 2(d). While zero incident dose revealed an n-type doping from HSQ, a significant electron beam dose revealed a p-type doping. For p-type HSQ doping, electron-hole symmetry was observed in the gated I-V curve near the location of the Dirac point.

Figure 3:
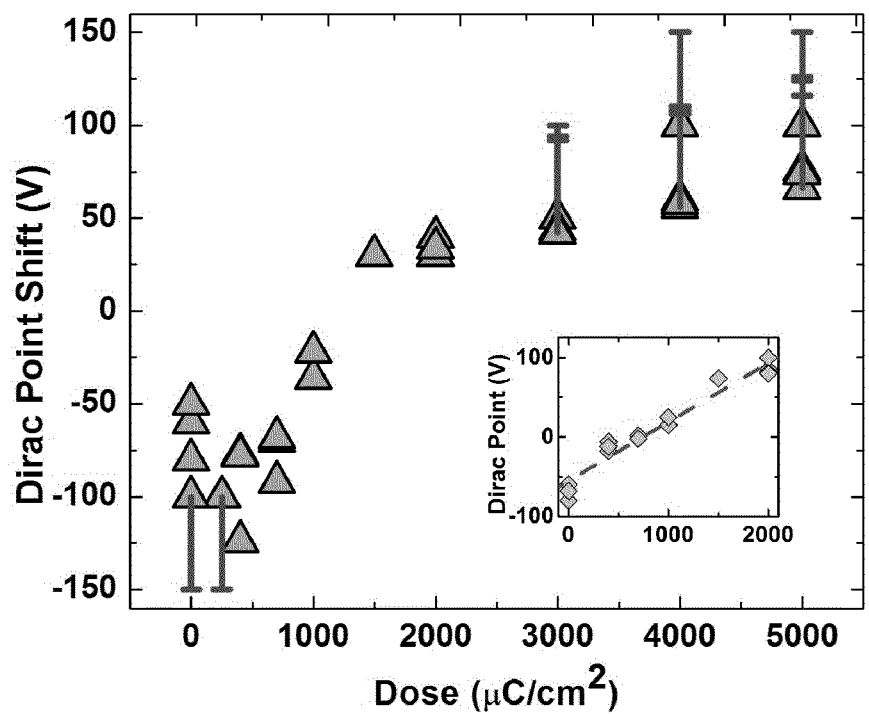
FIG. 3 provides dose versus Dirac point shift for HSQ coated devices in accordance with EXAMPLE 1, wherein about 20 micrometer circles of graphene were patterned using various electron beam doses and the resulting plots show the transition from n-type to p-type doping as dose is increased. Error bars indicate regions where the Dirac point has shifted outside of the gated testing capabilities (i.e., ±100V). Variations in the data points are attributed to intrinsic doping levels, which varies between devices. The inset shows the actual Dirac point location for various devices.

Increasing incident dose on HSQ increased the degree of cross-linking, and this in-turn was thought to cause a higher level of p-doping. To test this hypothesis further, a number of devices were fabricated, each with a different dose for the HSQ region. The incident dose ranged from 250 to 5,000 $\mu C/cm^2$. FIG. 3 plots the Dirac point shift (i.e., the difference in the Dirac point voltage ($V_D$) between metallization and HSQ patterning) for varying doses. Since HSQ induced doping was determined by the resulting shift in the Dirac point, the induced doping was able to be plotted regardless of the initial doping level of the devices. Error bars indicate shifts of the Dirac point outside of the back-gate bias range (±100 V). For zero dose (i.e., HSQ was spun-on and developed without any electron beam irradiation), a large negative shift in $V_D$ was seen and was consistent with results above. For a dose between about 250 to about 1000 $\mu C/cm^2$, the $V_D$ shift ($\Delta V_D$) increased from more than about −100 V to about 0 V. For doses between 1000 to 5000 $\mu C/cm^2$, $\Delta V_D$ increased from about 0 V to more than about 100 V, and a saturation was seen in the amount of shift induced. This saturation is likely due to saturation of cross-linking for doses higher than 2000 $\mu C/cm^2$.

Figure 4:
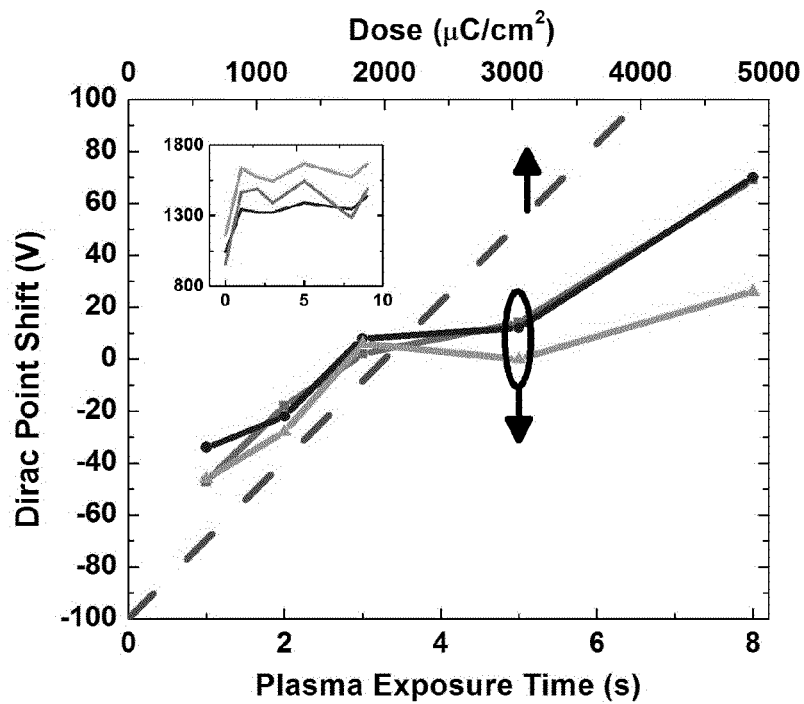
FIG. 4 verifies that plasma exposure of a HSQ film reveals complementary doping similar to electron beam irradiation in accordance with EXAMPLE 1. Three separate devices had a 20 micrometer circle of HSQ patterned thereon. These devices were then exposed to a low-power Argon plasma to induce HSQ cross-linking. It can be seen that devices show similar characteristics to that of electron beam exposed devices (dashed line). Brief plasma exposure induces n-type doping (negative Dirac point shift) while prolonged exposure induces advanced cross-linking and p-type doping (positive Dirac point shift). The inset shows mobility, in $cm^2/Vs$, which was calculated through each stage of exposure and was found to be relatively constant, indicating minimal damage to the graphene surface.

To investigate plasma-induced cross-linking, three graphene devices with metal contacts were fabricated and coated with about 30 nm HSQ. The devices were exposed to a low dose of about 600 $\mu C/cm^2$ (with the same pattern as in FIG. 2(c)) to obtain a layer of HSQ patterned on the device while inducing little shift in the Dirac point. This was followed by a timed exposure to a low-power Argon plasma with an Argon flow rate of about 25 standard cubic centimeters (sccm). Short, one second, flash exposures to the plasma were used, followed by electrical testing in between each step. FIG. 4 plots the behavior of a set of devices with increasing exposure time to the plasma. After an initial exposure of about 1 second, the Dirac point was shifted negative by about 40 V. After this, an increasing exposure time was seen to shift the Dirac point to positive values. The $V_D$ transition here was driven entirely by structural changes in HSQ affecting the bonding to graphene. FIG. 4 also shows mobility versus exposure time; mobility is calculated using the carrier density method, using the relation: $\mu=1/(n\rho e)$, where $n=5\times10^{12}$ cm$^{-2}$ is the carrier density, $\rho$ is the resistivity, and e is electronic charge. Mobility showed improvement at early stages of cross-linking, followed by a saturation at longer exposure times. There was no degradation of mobility even for long exposure times indicating that there was little surface damage to the graphene as a result of interaction with the plasma. Mobility has a strong dependence on impurity-induced scattering, and the impurity density limits mobility of devices in this work to less than 2200 cm$^2$/V-s. Specifically, this doping method did not degrade mobility, and actually improved mobility in the plasma-exposure method, as can be seen in FIG. 4.

Without intending to be limited by theory, the dual nature of HSQ—resulting in both n-type and p-type doping of graphene—was attributed to the mismatch of bond strengths between Si:H and Si:O bonds in the HSQ film, as well as the out-gassing of hydrogen at higher degrees of cross-linking. It has been predicted that basal-plane adsorption of hydrogen leads to n-type doping of graphene. It is also known that adsorption of species from the ambient environment, specifically water vapor and oxygen, lead to p-type doping. In HSQ, Si—H bonds are more easily broken than Si—0 bonds. Si-H bonds have a bond strength of about 4.08 eV while Si—O bonds have a bond strength of about 8.95 eV. At low degrees of cross-linking, Si—H bonds are readily broken providing hydrogen to bond with the graphene basal-plane. Due to the offset in electro-negativity, hydrogen acts as an n-type dopant for graphene. Higher degrees of cross-linking in the HSQ film lead to p-type doping. There are two primary mechanisms that facilitate the switch from electron to hole carriers in the material. The first is that Si—O bonds begin to break at more mature stages of cross-linking due to their larger bond strength. The breaking of Si—O bonds provides oxygen for adsorption at the graphene surface. The second contributor to the observed p-type doping is the removal of hydrogen from the HSQ film. Advanced stages of cross-linking lead to HSQ decomposing into $SiH_4$ and $H_2$ components. These components escape from the HSQ film, as evident through decreased Si—H:Si—O bond ratios as well as the porous nature of the film.

Doping through plasma exposure can be used to provide rapid doping over the surface of large area graphene with minimal reduction of mobility. This would be beneficial to applications that need conductivity higher than that offered by intrinsic graphene (e.g., on-chip interconnects). Spin-coating graphene ribbons with a layer of HSQ and subjecting them to plasma exposure would result in high-conductivity graphene ribbons as well as a low dielectric constant (low-k) coating that is required as an inter-layer dielectric between interconnect layers. Thus, the methods of the present invention can be used to create a low-k inter-layer dielectric for use in an interconnect.

Figure 5:
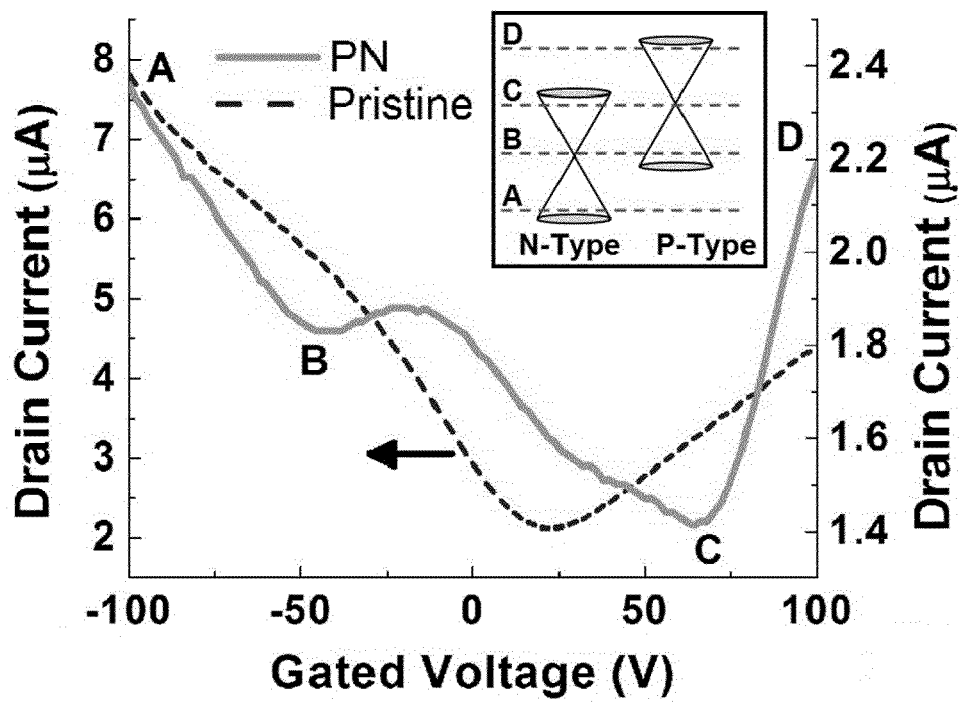
FIG. 5 evidences that a nanoscale p-n junction was fabricated in accordance with EXAMPLE 1 using HSQ complementary doping. Specifically, the gated I-V testing of FIG. 5(a) reveals the super-position of two separate Dirac points, indicating the formation of adjacent p- and n-type regions. The separation of the two Dirac points indicates a separation in the Fermi levels of the two complementary regions in excess of about 340 meV.
Figure 5:
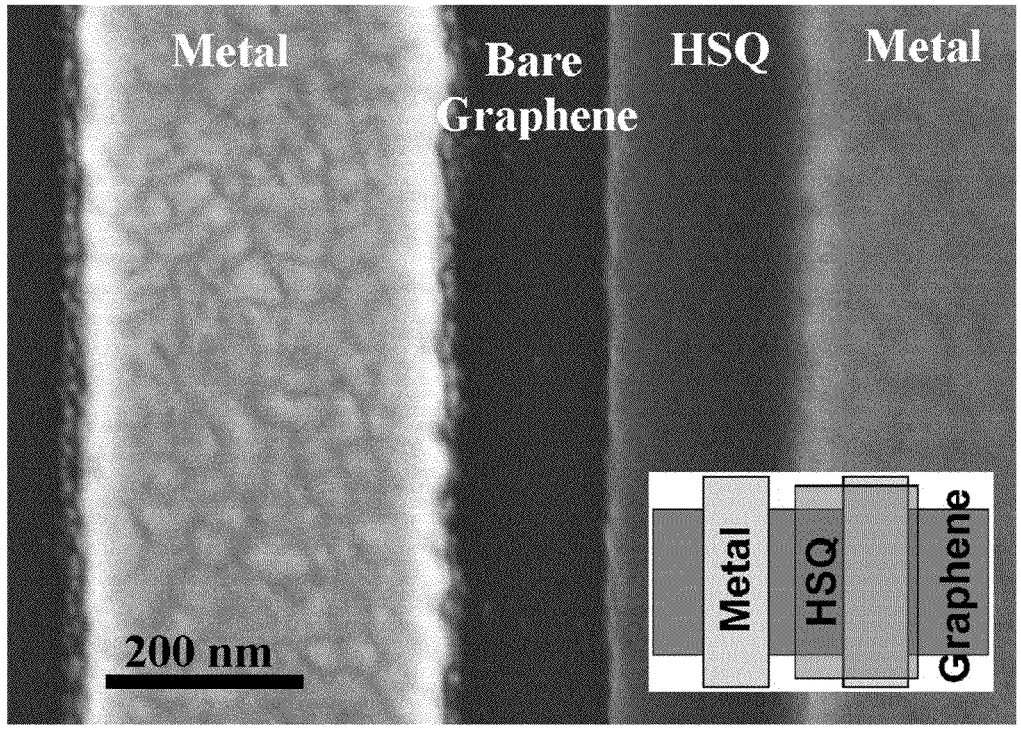

Fabrication of a nanoscale p-n junction via HSQ doping was demonstrated, evidence of which can be seen in FIG. 5. An HSQ stripe was exposed over half of a graphene channel while leaving the other half unexposed, defining the p and n regions, respectively. Gated I-V testing revealed two distinct Dirac points, indicating complementary regions of doping. It has been shown that local minimums in gated-current testing are indicative of p-n junction formation in graphene devices. Thus, the data of this example serves as evidence of a chemically doped graphene p-n junction with Dirac points clearly indicating the superposition of p and n regions and with separations in excess of about 100 V. Using the relation between Fermi level and carrier density, the p-n junction demonstrated in this example is expected to exhibit separation in quasi-Fermi levels in excess of about 340 meV.

Deviations from the expected location of the Dirac points have been previously observed and are attributed to induced states that allow carrier penetration into the adjacent region. Extension of locally doped carriers into the adjacent complementary regions by up to about 450 nm have been observed. The levels of doping presented in this example were shown to be significantly high enough to maintain locally defined p-and n-type regions, despite slight degradation due to carrier mixing between the two complementary doped regions. As with any graphene device, prolonged exposure to the ambient environment induced a background p-type doping to the fabricated p-n junction. Passivation was implemented to pin the Fermi levels in both the p- and n-type regions.

In summary, this example demonstrates that HSQ films on graphene are capable of complementary doping. Since HSQ can be patterned with high resolution, the method of this example provides high-resolution fabrication of n-and p-doped regions. The n- and p-type doping mechanism of HSQ was attributed to basal plane bonding of hydrogen and oxygen, respectively. The duality of this process resulted from the mismatch in bond strengths between Si:H and Si:O bonds in the material as well as the out-gassing of hydrogen from the film at higher levels of cross-linking. Cross-linking of the HSQ film was induced either by electron-beam irradiation or low power plasma exposure, allowing for complementary doping in a single processing step. Finally, a graphene p-n junction was fabricated using HSQ doping and was found to have large Fermi-level separations, indicating strong p and n-type doping.

Example 2

In this example, an electron waveguide device was fabricated. The device was fabricated using the complementary doping method procedure described in EXAMPLE 1. Basically, the process included deposition of graphene onto the substrate, followed by lithographic patterning of contact metallization, deposition of contact metallization, spin coating of HSQ atop the graphene, patterning of HSQ using electron beam lithography, and developing the HSQ to remove portions of it from the graphene surface.

Figure 6:
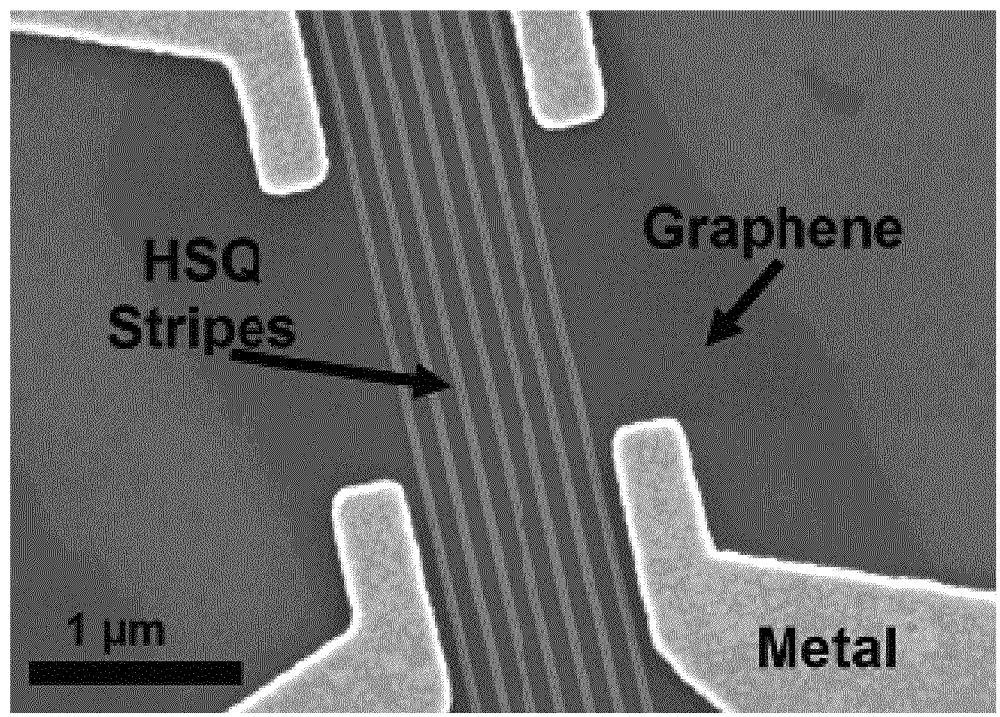
FIG. 6 illustrates an electron waveguide device in accordance with EXAMPLE 2. Specifically.
Figure 6:
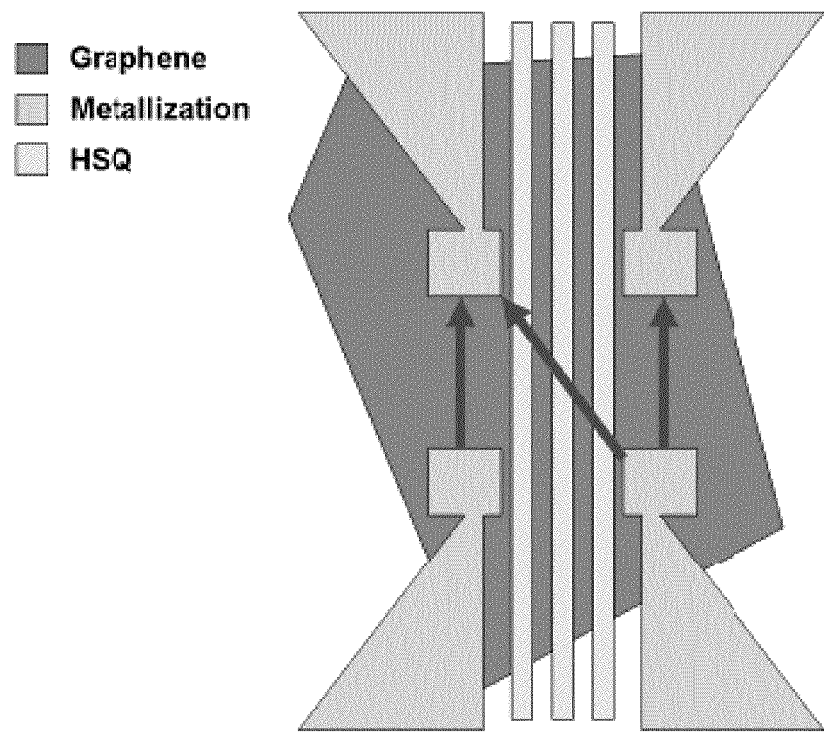

A scanning electron microscope (SEM) image of the device is shown in FIG. 6(a), while a schematic illustration is shown in FIG. 6(b).

Briefly, in FIG. 6(a), thick HSQ is displayed as bright regions. These regions are p-type and the HSQ film remains on the graphene. All other areas of the graphene are n-type doped. The n-type doping regions are darker and consist only of a very thin residue of HSQ. The outline of the graphene sheet can be seen as a dark region.

In FIG. 6(b), the HSQ stripes in the center of the device produce p-n junctions in the graphene. Electrical conduction across these p-n junctions, shown by the slanted arrow, is hindered while electrical conduction through the un-patterned graphene, vertical arrows, is allowed. P-N junctions here act as a guide to channel electrical current along the direction of the vertical arrows and not the slanted one. This is an alternative to simply etching or removing the graphene between the vertical arrows.

Example 3

In this example, a transistor-like device was fabricated. The device was fabricated using the complementary doping method procedure described in EXAMPLE 1. Basically, the process included deposition of graphene onto substrate, followed by lithographic patterning of contact metallization, deposition of contact metallization, spin coating of HSQ atop the graphene, patterning of HSQ using electron beam lithography, and developing the HSQ to remove portions of it from the graphene surface.

Figure 7:
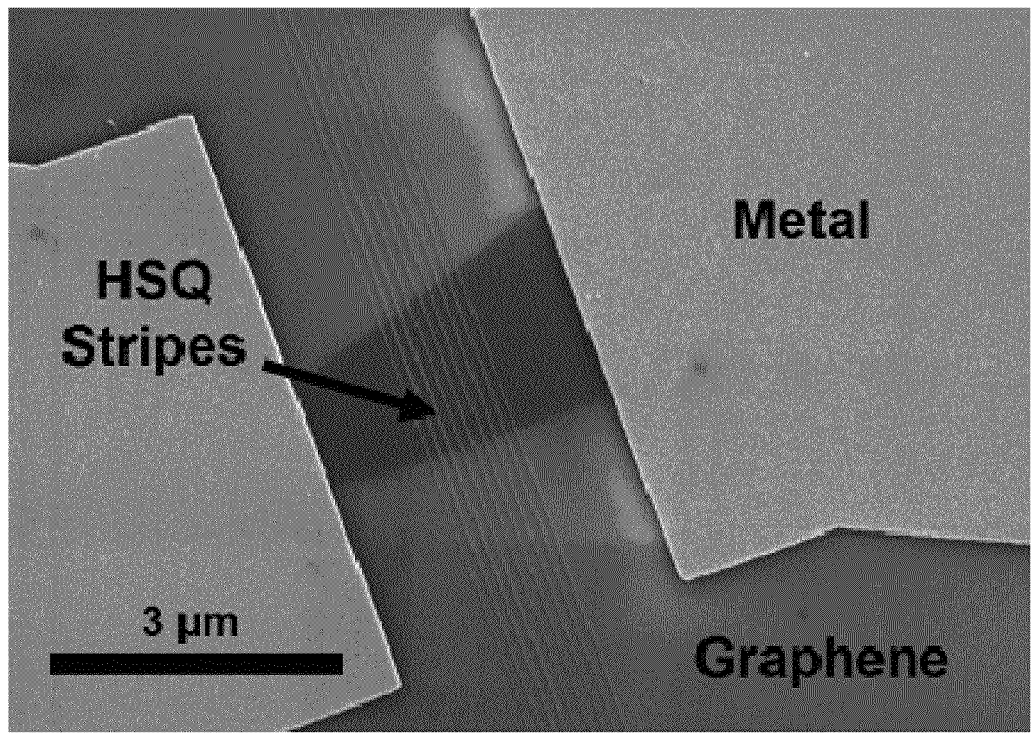
FIG. 7 illustrates a transistor-like device in accordance with EXAMPLE 3. Specifically.
Figure 7:
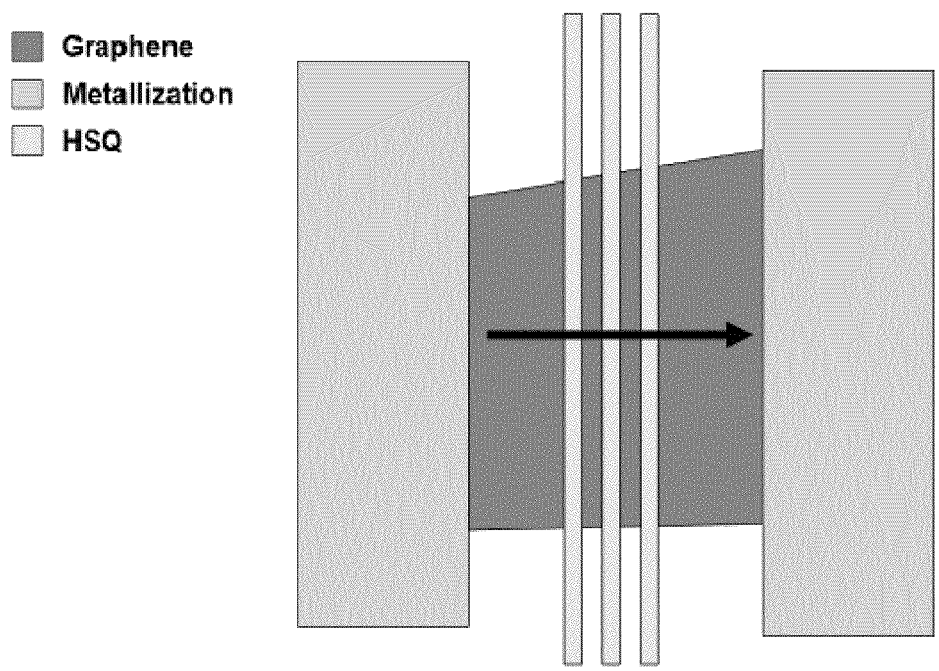

A SEM image of the device is shown in FIG. 7(a), while a schematic illustration is shown in FIG. 7(b).

Briefly, in FIG. 7(a), thick HSQ is displayed as bright regions. These regions are p-type and the HSQ film remains on the graphene. All other areas of the graphene are n-type doped. The n-type doping regions are darker and consist only of a very thin residue of HSQ. The outline of the graphene sheet can be seen as a dark region.

In FIG. 7(b), current flow (shown as the arrow) between the two metal pads is forced across p-n junctions generated using HSQ stripes. By modulating the Fermi level of the device externally, conduction flow through the p-n junctions can be controlled, generating a high current (ON) state and low current (OFF) state.

Example 4

In this example, a p-n junction dot array device was fabricated. The device was fabricated using the complementary doping method procedure described in EXAMPLE 1. Basically, the process included deposition of graphene onto substrate, followed by lithographic patterning of contact metallization, deposition of contact metallization, spin coating of HSQ atop the graphene, patterning of HSQ using electron beam lithography, and developing the HSQ to remove portions of it from the graphene surface.

Figure 8:
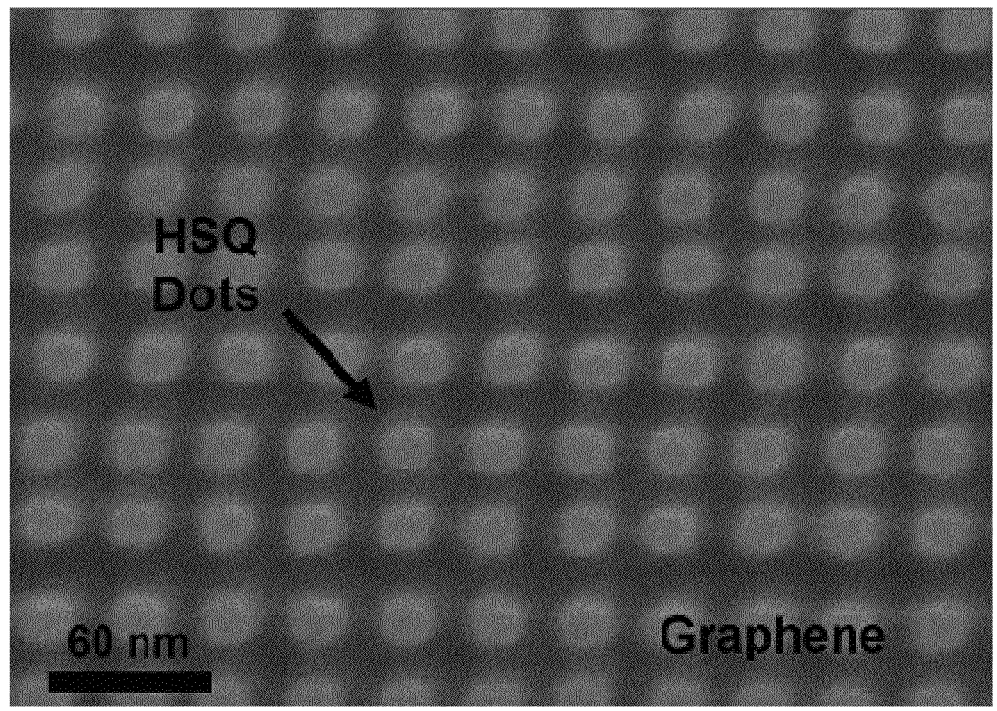
FIG. 8 illustrates a p-n junction dot array device in accordance with EXAMPLE 4. Specifically.
Figure 8:
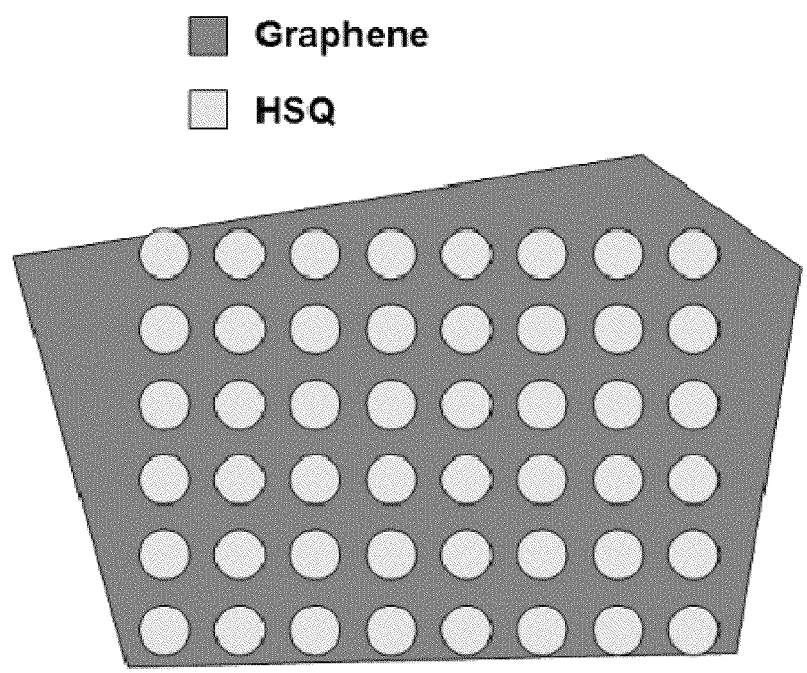

A SEM image of the device is shown in FIG. 8(a), while a schematic illustration is shown in FIG. 8(b).

Briefly, in FIG. 8(a), thick HSQ is displayed as bright regions. These regions are p-type and the HSQ film remains on the graphene. All other areas of the graphene are n-type doped. The n-type doping regions are darker and consist only of a very thin residue of HSQ. The outline of the graphene sheet can be seen as a dark region.

In FIG. 8(b), high resolution p and n regions were created in graphene using dots of HSQ. This type of architecture could potentially be utilized to generate artificial energy gaps in the material.

The embodiments of the present invention are not limited to the particular formulations, process steps, and materials disclosed herein as such formulations, process steps, and materials can vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, temperature and pressure parameters can vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

What is claimed is:

1. A complementary doping method, comprising:
providing a thin film of a semiconductor or semimetal disposed on a substrate;
disposing a dopant source on a surface of the thin film of the semiconductor or semimetal; wherein the disposing does not include implantation or diffusion of the dopant source;
inducing a first chemical reaction at a first energy in at least a first portion of the dopant source effective to introduce an n-type dopant, a p-type dopant, or both to the at least the first portion of the thin film of the semiconductor or semimetal; and
inducing a second chemical reaction at a second energy in at least a second portion of the dopant source effective to introduce an n-type dopant, a p-type dopant, or both to the at least the second portion of the surface of the thin film of the semiconductor or semimetal;
wherein the first and second chemical reaction are effective to produce at least one n-type and at least one p-type region on the surface of the thin film of the semiconductor or semimetal.

2. The method of claim 1, wherein the semimetal is graphene.

3. The method of claim 1, wherein the dopant source comprises a electromagnetic radiation-sensitive material.

4. The method of claim 3, wherein the electromagnetic radiation-sensitive material comprises a polymer precursor, a polymer, or a resist material.

5. The method of claim 1, wherein the dopant source is a spin-on glass.

6. The method of claim 5, wherein the spin-on glass is a silicate, siloxane, phosphosilicate, or borosilicate.

7. The method of claim 6, wherein the siloxane is a poly(silsequioxane).

8. The method of claim 1, wherein inducing the first and/or second chemical reaction comprises irradiating with a light source, irradiating with an ion beam source, irradiating with an electron beam, thermally heating, dielectrically heating, or a combination thereof.

9. The method of claim 1, wherein the first and/or second chemical reaction comprises a polymerization, a solvent removal, a cross-linking, an internal rearrangement of atoms or moieties, or a combination thereof.

10. The method of claim 1, further comprising inducing a third chemical reaction in at least a third portion of the dopant source effective to introduce an n-type dopant, a p-type dopant, or both to the third portion of the thin film of the semiconductor or semimetal.

11. The method of claim 1, wherein a distance between an n-type and a p-type region in the thin film of the semiconductor or semimetal is less than or equal to about 30 nanometers.

12. The method of claim 1, wherein a distance between an n-type and a p-type region in the thin film of the semiconductor or semimetal is less than or equal to about 10 nanometers.

13. The method of claim 1, further comprising removing an unreacted portion of the dopant source from the thin film of the semiconductor or semimetal.

14. The method of claim 1, further comprising sealing a surface of the thin film of the semiconductor or semimetal after inducing the second chemical reaction.

15. A complementary doping method, comprising:
providing a thin film of graphene on a substrate;
spin-coating a spin-on glass on the thin film of the graphene;
inducing a first chemical reaction in at least a first portion of the spin-on glass effective to introduce an n-type dopant, a p-type dopant, or both to the at least the first portion of the thin film of the graphene; and
inducing a second chemical reaction in at least a second portion of the spin-on glass effective to introduce an n-type dopant, a p-type dopant, or both to the at least the second portion of the thin film of the graphene;
wherein the first and second chemical reaction are effective to produce at least one n-type and at least one p-type region in the thin film of the graphene.

16. The method of claim 15, wherein inducing the first chemical reaction comprises thermally treating the at least the first portion of the spin-on glass to remove a solvent from the spin-on glass, and is effective to produce an n-type region in the at least the first portion of the spin-on glass.

17. The method of claim 16, wherein inducing the second chemical reaction comprises irradiating the at least the second portion of the spin-on glass to cross-link the at least the second portion of the spin-on glass, and is effective to produce a p-type region in the at least the second portion of the spin-on glass.

18. The method of claim 15, wherein inducing the first chemical reaction and/or inducing the second chemical reaction comprises irradiation with electromagnetic radiation to cross-link an irradiated portion of the spin-on glass.

19. The method of claim 15, further comprising removing at least an unreacted portion of the spin-on glass without affecting the at least one n-type and at least one p-type region in the thin film of the graphene.

* * * * *